(12) United States Patent
Le et al.

(10) Patent No.: US 7,566,900 B2
(45) Date of Patent: Jul. 28, 2009

(54) INTEGRATED METROLOGY TOOLS FOR MONITORING AND CONTROLLING LARGE AREA SUBSTRATE PROCESSING CHAMBERS

(75) Inventors: Hienminh Huu Le, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 11/216,801

(22) Filed: Aug. 31, 2005

(65) Prior Publication Data

US 2007/0046927 A1 Mar. 1, 2007

(51) Int. Cl.
*H01L 29/10* (2006.01)
(52) U.S. Cl. .......................................... 257/48
(58) Field of Classification Search ................... 438/5, 438/14, 689, 795, 630
See application file for complete search history.

(56) References Cited

U.S. PATENT DOCUMENTS

| | | | |
|---|---|---|---|
| 5,926,090 A | 7/1999 | Taylor et al. | |
| 6,238,937 B1 | 5/2001 | Toprac et al. | |
| 6,368,975 B1 | 4/2002 | Balasubramhanya et al. | |
| 6,388,253 B1 | 5/2002 | Su | |
| 6,413,867 B1 | 7/2002 | Sarfaty et al. | |
| 6,419,846 B1 | 7/2002 | Toprac et al. | |
| 6,455,437 B1 | 9/2002 | Davidow et al. | |
| 6,486,492 B1 | 11/2002 | Su | |
| 6,521,080 B2 | 2/2003 | Balasubramhanya et al. | |
| 6,911,399 B2 | 6/2005 | Liu et al. | |
| 6,943,039 B2 | 9/2005 | Ying et al. | |
| 2002/0055259 A1 | 5/2002 | Balasubramhanya et al. | |
| 2003/0020928 A1* | 1/2003 | Ritzdorf et al. | 356/630 |
| 2003/0045098 A1* | 3/2003 | Verhaverbeke et al. | 438/689 |
| 2003/0045131 A1* | 3/2003 | Verbeke et al. | 438/795 |
| 2005/0019961 A1 | 1/2005 | Davis et al. | |
| 2005/0032250 A1* | 2/2005 | Mui et al. | 438/14 |
| 2007/0134821 A1* | 6/2007 | Thakur et al. | 438/5 |

OTHER PUBLICATIONS

Rudolph Technologies Application Reports, PULSE Technology™, http://www.rudolphtech.com/company/company.asp, 2000-2005.
Rudolph Technologies, Inc., Company Website, http://www.rudolphtech.com/company/company.asp, 2000-2005.
U.S. Appl. No. 10/939,158, filed Aug. 19, 2003.
U.S. Appl. No. 11/181,043, filed Jul. 13, 2005.
U.S. Appl. No. 11/213,662, filed Aug. 26, 2005.
U.S. Appl. No. 11/185,535, filed Jul. 19, 2005.
U.S. Appl. No. 11/185,523, filed Jul. 19, 2005.
Yue, et al. "Plasma etching endpoint detection using multiple wavelengths for small open-area wafers," J. Vac. Sci. Technol. A. 19(1), Jan./Feb. 2001, p. 66-75.

* cited by examiner

*Primary Examiner*—Charles D. Garber
*Assistant Examiner*—Andre' C Stevenson
(74) *Attorney, Agent, or Firm*—Patterson & Sheridan, LLP

(57) ABSTRACT

Embodiments of an apparatus and method of monitoring and controlling a large area substrate processing chamber are provided. Multiple types of metrology tools can be installed in the substrate processing system to measure film properties after substrate processing in a processing chamber. Several number of a particular type of metrology tools can also be installed in the substrate processing system to measure film properties after substrate processing in a processing chamber. The metrology tools can be installed in a metrology chamber, a process chamber, a transfer chamber, or a loadlock.

2 Claims, 8 Drawing Sheets

INTEGRATED METROLOGY TOOLS FOR MONITORING AND CONTROLLING LARGE AREA SUBSTRATE PROCESSING CHAMBERS

BACKGROUND OF THE INVENTION

1. Field of the Invention

Embodiments of the invention generally relate to an apparatus and method for large area substrate processing. In particular, the invention relates to using integrated metrology tools for monitoring and controlling large area substrate processing chambers.

2. Description of the Related Art

Fabrication of semiconductor integrated circuits (IC), flat panel display (FPD) devices, and solar panel devices require processing of multilayer film stacks to create devices, conductors and insulators on a substrate. One example of a multilayer film stack is a thin film transistor (TFT) structure useful for fabricating liquid crystal display (LCD) devices. FIG. 1 (Prior Art) illustrates a cross-sectional schematic view of a thin film transistor structure, which is a common back channel etch (BCE) inverted staggered (or bottom gate) TFT structure. The substrate 101 may comprise a material that is essentially optically transparent in the visible spectrum, such as glass or clear plastic. Typically, for TFT applications, the substrate is a glass substrate with a large surface area, i.e. greater than about 750 cm$^2$. A gate electrode layer 102 is formed on the substrate 101. The gate electrode layer 102 comprises an electrically conductive layer that controls the movement of charge carriers within the TFT. Between the substrate 101 and the gate electrode layer 102, there may be an optional insulating material. A gate dielectric layer 103 is formed on the gate electrode layer 102. A bulk semiconductor layer 104 is formed on the gate dielectric layer 103. A doped semiconductor layer 105 is formed on top of the semiconductor layer 104. The bulk semiconductor layer 104 and the doped semiconductor layer 105 are lithographically patterned and etched using conventional techniques to define a mesa of these two films over the gate dielectric insulator, which also serves as a storage capacitor dielectric. The doped semiconductor layer 105 directly contacts portions of the bulk semiconductor layer 104, forming a semiconductor junction. A conductive layer 106 is then deposited on the exposed surface. Both the conductive layer 106 and the doped semiconductor layer 105 may be lithographically patterned to define source and drain contacts of the TFT. Afterwards, a passivation layer 107 may be deposited. A transparent conductor layer 108 is then deposited and patterned to make contacts with the conductive layer 106.

In general, the substrate for device fabrication is subjected to various processes, such as sputtering, chemical vapor deposition (CVD), physical vapor deposition (PVD), lithography, etching, ion implantation, ashing, cleaning, heating, annealing, and the like in a specific multi-step fabrication sequence to process layers of metal and silicon containing films thereon. For example, the substrate is processed through steps of deposition, patterning, lithography and etching repeated multiple times. Typically, a process chamber is usually configured to deposit a single layer on a substrate. In addition, a number of process chambers can also be coupled together to a central transfer chamber for multi-substrate processing in a multi-substrate processing platform, such as a cluster tool, examples of which are the families of AKT PECVD, PRODUCER®, CENTURA® and ENDURA® processing platforms available from Applied Materials, Inc., of Santa Clara, Calif.

Physical vapor deposition (PVD), or sputtering, is one of the most commonly used processes in devices fabrication. PVD is a plasma process performed in a vacuum process chamber where a negatively biased target with respect to a chamber body or a grounded sputter shield is exposed to a plasma of a gas mixture comprising gases such as inert gases (e.g., argon (Ar)). Bombardment of the target by ions of the inert gas results in ejection of atoms of the target material. In some case, a magnetron is positioned in the back of the target to project a magnetic field parallel to the front side of the target to trap electrons and increase plasma density and sputtering rate. The ejected atoms accumulate as a deposited film on a substrate placed on a substrate pedestal disposed within the process chamber.

Plasma enhanced chemical vapor deposition (PECVD) is generally employed to deposit thin films on a substrate such as a transparent substrate for flat panel display or semiconductor wafer. PECVD is generally accomplished by introducing a precursor gas or gas mixture into a vacuum chamber that contains a substrate. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material on a surface of the substrate that is positioned on a temperature controlled substrate support. Volatile by-products produced during the reaction are pumped from the chamber through an exhaust system.

As the demand for semiconductor, flat panel, and solar panel devices continues to grow, there is a trend to reduce cost by increasing the sizes of the substrates for large scale fabrication. For example, glass substrates utilized for flat panel fabrication, such as those utilized to fabricate computer monitors, large screen televisions, displays for PDAs and cell phones and the like, have increased in size from 550 mm×650 mm to 1500 mm×1800 mm in just a few years and are envisioned to exceed four square meters in the near future. The dimensions of a process chamber or a multi-substrate processing platform have become ever so large.

Substrate mis-processing due to faults in the process chamber could result in scrapping of the substrate, which could have gone through many previous processing steps. Without timely detecting the faults in the process chamber, numerous substrates could be mis-processed and need to be scrapped. For large area substrates, the cost of scrapping these substrates could be substantial. Therefore, it is desirable to monitor and control the substrate processing chamber to ensure targeted substrate processing is properly performed on the substrates to reduce the risk of miss-processing of the substrates.

As a consequence, there is a need for an apparatus and method of monitoring and/or controlling a large area substrate processing chamber.

SUMMARY OF THE INVENTION

Embodiments of an apparatus and method of monitoring and controlling a large area substrate processing chamber are provided. In one embodiment, a metrology chamber of a substrate processing module adapted to monitor and/or control at least one substrate processing chamber of the substrate processing module comprises at least one first type of metrology tool, and at least one second type of metrology tool.

In another embodiment, a method of monitoring and/or controlling at least one substrate processing chamber of a substrate processing module by using the metrology tools of a metrology chamber of the substrate processing module comprises processing a substrate in one of the at least one substrate processing chamber of the substrate processing module, moving the substrate to the metrology chamber, measuring a first property of the substrate by at least one first type of metrology tool of the metrology chamber, and measuring a second property of the substrate by at least one second type of metrology tool of the metrology chamber.

In yet another embodiment, an apparatus of a large area substrate processing module adapted to monitor and/or control at least one large area substrate processing chamber of the large area substrate processing module comprises at least one first type of metrology tool adapted to measure a first substrate property of the large area substrate whose surface area is greater than 750 cm$^2$.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The embodiments of the invention provide an apparatus and method of monitoring and controlling a large area substrate processing system. The concept of the invention can be applied to targets greater than 750 cm$^2$, preferably to targets greater than 2000 cm$^2$, more preferably to targets greater than 15000 cm$^2$, and most preferably to targets greater than 40000 cm$^2$.

Figure 1:
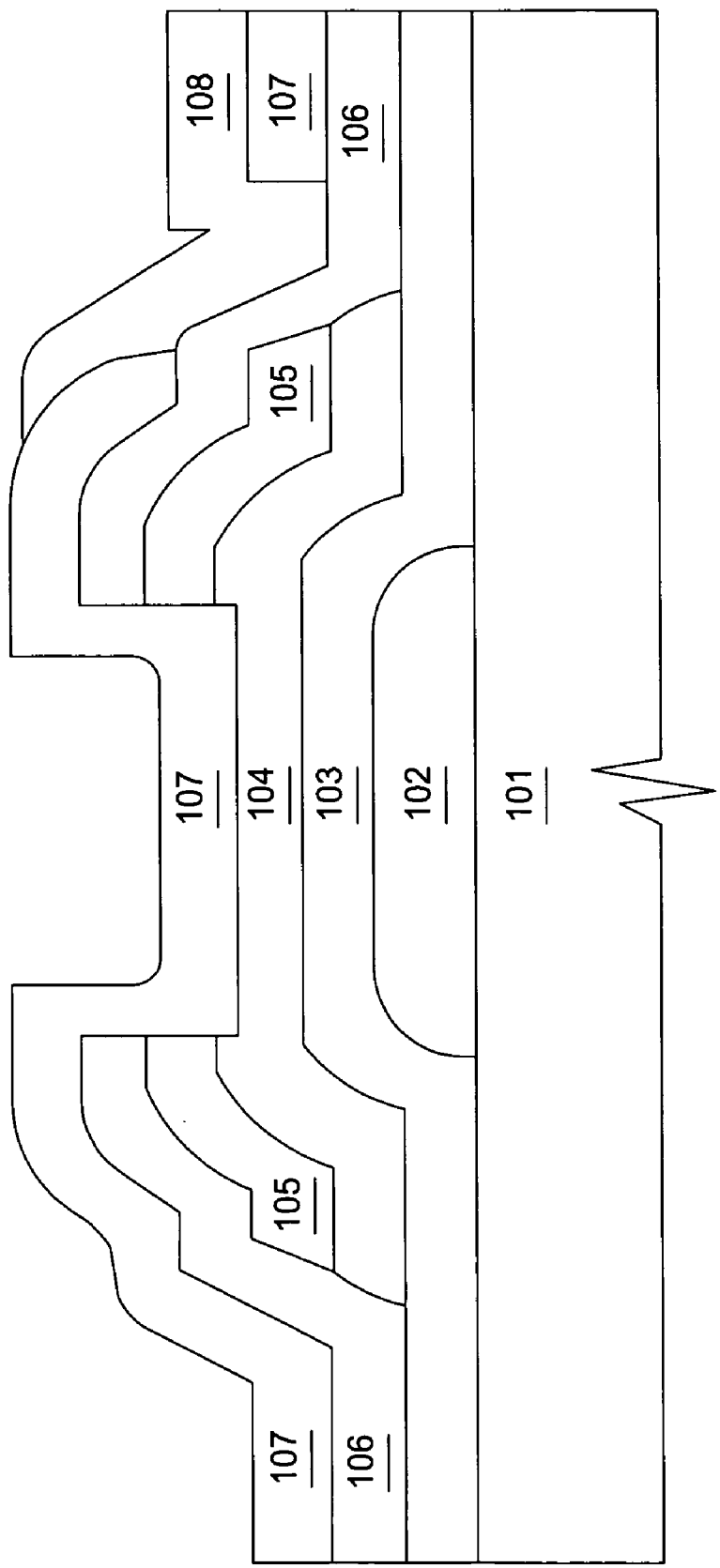
FIG. 1 (Prior Art) depicts a cross-sectional schematic view of an exemplary bottom gate thin film transistor.

The silicon-containing layers and the metal containing layers in FIG. 1 can be processed in high volume and high throughput by different types of process chambers, for example, physical vapor deposition (PVD) and sputtering chambers, ion metal implant (IMP) chambers, chemical vapor deposition (CVD) chambers, atomic layer deposition (ALD) chambers, plasma etching chambers, annealing chambers, other furnace chambers, cleaning stations, etc. The substrate processing system may include a deposition chamber in which a substrate is exposed to one or more gas-phase materials or plasma. In one embodiment, a cluster type substrate processing system including at least one physical vapor deposition (PVD) process chamber is provided for deposition of metal layer(s). In another embodiment, a hybrid cluster type substrate processing system including at least one physical vapor deposition (PVD) process chamber and at least one chemical vapor deposition (CVD) process chamber is provided for deposition of metal and silicon-containing layers of a film stack in the same substrate processing system. In yet another embodiment, the substrate processing system is also configured to include various types of process chambers to perform different etching, deposition, annealing, and cleaning processes.

For systems with PVD and/or CVD processing chambers, the performance or condition of the PVD and/or CVD processing chambers can be monitored and controlled by using metrology tools to collect post-processing film information, such as film thickness, film composition, sheet resistance, film stress, particle count, and the like, after substrate processing. Some measurement, such as film stress, requires pre-measurement to determine the post-deposition stress value. The post-processing measurement information may be used to monitor for example, thickness trend, the film stress trend, the film content trend, conductive film sheet resistance trend, and particle count trend. The measurement information can be used to detect a fault in the system, which may cause the measured data to suddenly fall outside a pre-determined control range or the measured data trend differs from the normal data trend. Once the fault is detected, the system can be set up to prevent further substrate processing until the source(s) of fault is identified or corrected.

Figure 2:
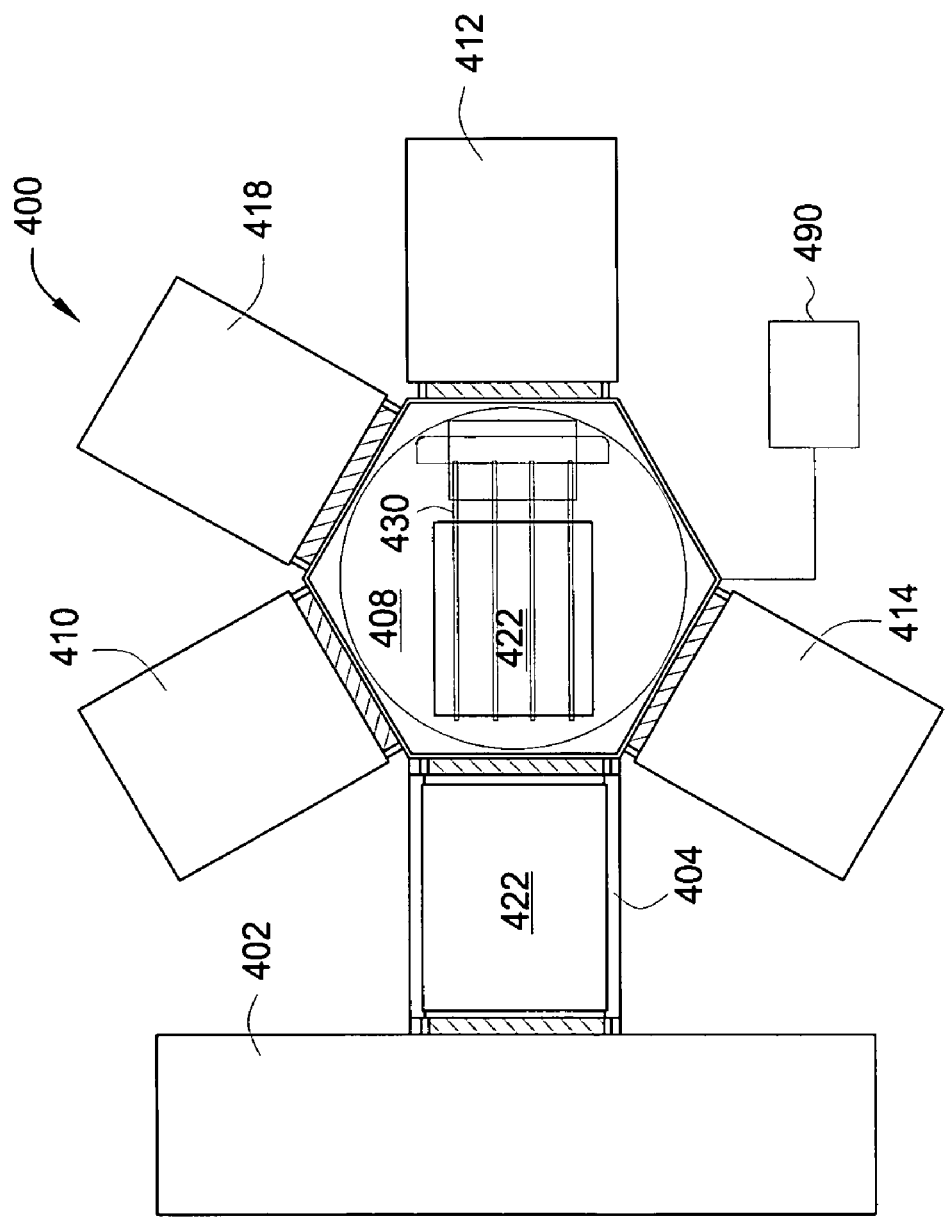
FIG. 2 depicts an exemplary PVD processing system.

The measurement can be performed in-situ, which occurs in the processing chamber, or ex-situ, which occurs outside the processing chamber. In one embodiment, a cluster type substrate processing system 400, as shown in FIG. 2, including at least one first physical vapor deposition (PVD) process chamber, for example chamber 410, configured to deposit a first metal material layer on a substrate and at least one second physical vapor deposition (PVD) process chamber, for example chamber 412, for deposition of a second metal material layer over the first metal material layer on the surface of the substrate without moving the substrate out of the system. In another embodiment, the substrate processing system is also configured to include other types of process chambers, for example chamber 414, to perform additional etching, deposition, annealing, and cleaning processes.

FIG. 2 shows a top plan view of an exemplary substrate processing system 400 suitable for sputtering multi-layers of metal films on a substrate 422. The substrate processing system 400 typically includes a transfer chamber 408 coupled to a factory interface 402 via a load lock chamber 404. The factory interface 402 generally includes one or more substrates stored therein or substrate storage cassettes. The substrate storage cassettes are typically removably disposed in a plurality of storage bays/compartments formed inside the factory interface 402. The factory interface 402 may also include an atmospheric robot, such as a dual blade atmospheric robot. The atmospheric robot is adapted to transfer one or more substrates between the one or more substrate storage cassettes and the load lock chamber 404. Typically, the factory interface 402 is maintained at or slightly above atmospheric pressure and the load lock chamber 404 is disposed to facilitate substrate transfer between a vacuum environment of the transfer chamber 408 and a generally ambient environment of the factory interface 402. The substrate 422 processed by the substrate processing systems can be transferred from the factory interface 402 to the load lock chamber 404 for processing of a fabrication sequence including two or more metal layer depositions on one or more substrates 422 without the substrate 422 leaving the system 400. Transfer robot 430 can transfer substrates between transfer chamber 408, process chambers 410, 412, 414, and metrology chamber 418

The measurement can be done in the transfer chamber 408, the loadlock 422, the process chambers, 410, 412, and 414, or in a separate metrology chamber, for example chamber 418. For PVD and/or CVD systems for processing large area substrates, the transfer chamber 408, the loadlock 422, the process chambers, 410, 412, and 412, and separate metrology chamber 418 are all very large to accommodate large area substrates. There is plenty of room in metrology chamber 418 to install multiple metrology tools to collect pre-processing and post-processing data on the substrates.

To improve process control, it is desirable to measure film properties, such as film thickness, film composition, sheet resistance, particle count, and film stress, after deposition in the process chamber. If the measured data fall out of the control range, the system can receive a control signal to suspend further substrate processing until the cause of process drift is identified. For example, the substrate 422 is placed in a PVD chamber 410 to deposit a first metal film. After the film deposition, the post-deposition film properties of the substrate 422 can be measured by metrology tools placed in the PVD chamber 410, or 412, the transfer chamber 408, a metrology chamber 418, or loadlock 422. In one embodiment, after a first metal film is deposited on the substrate 422, the substrate 422 is placed in a metrology chamber 418 to measure post-deposition properties. The post deposition film properties include, but are not limited to, properties such as film thickness, film content, sheet resistance, particle count, and film stress. After the film property has been measured, the substrate 422 can be placed in another PVD chamber 412 to deposit a second metal film. After the second film deposition, the post-deposition film properties of the substrate 422 can be measured by metrology tools placed in the PVD chamber 410, or 412, the transfer chamber 408, a metrology chamber 418, or loadlock 422. At least one film property is measured. The measurement can be done on both layers to monitor and control both chambers. The measurement can be done on only one layer to monitor and control only one chamber. When more than one process chamber is used, it is possible that only one chamber is selected to be monitored and controlled. Typically, the chamber that deposits a film whose film property is more critical, such as uniformity of a very thin film, is selected to be monitored. The substrate processing system 400 is controlled by a system control unit 490, which could include controller(s), computer (s), and memory (or memories).

Figure 3:
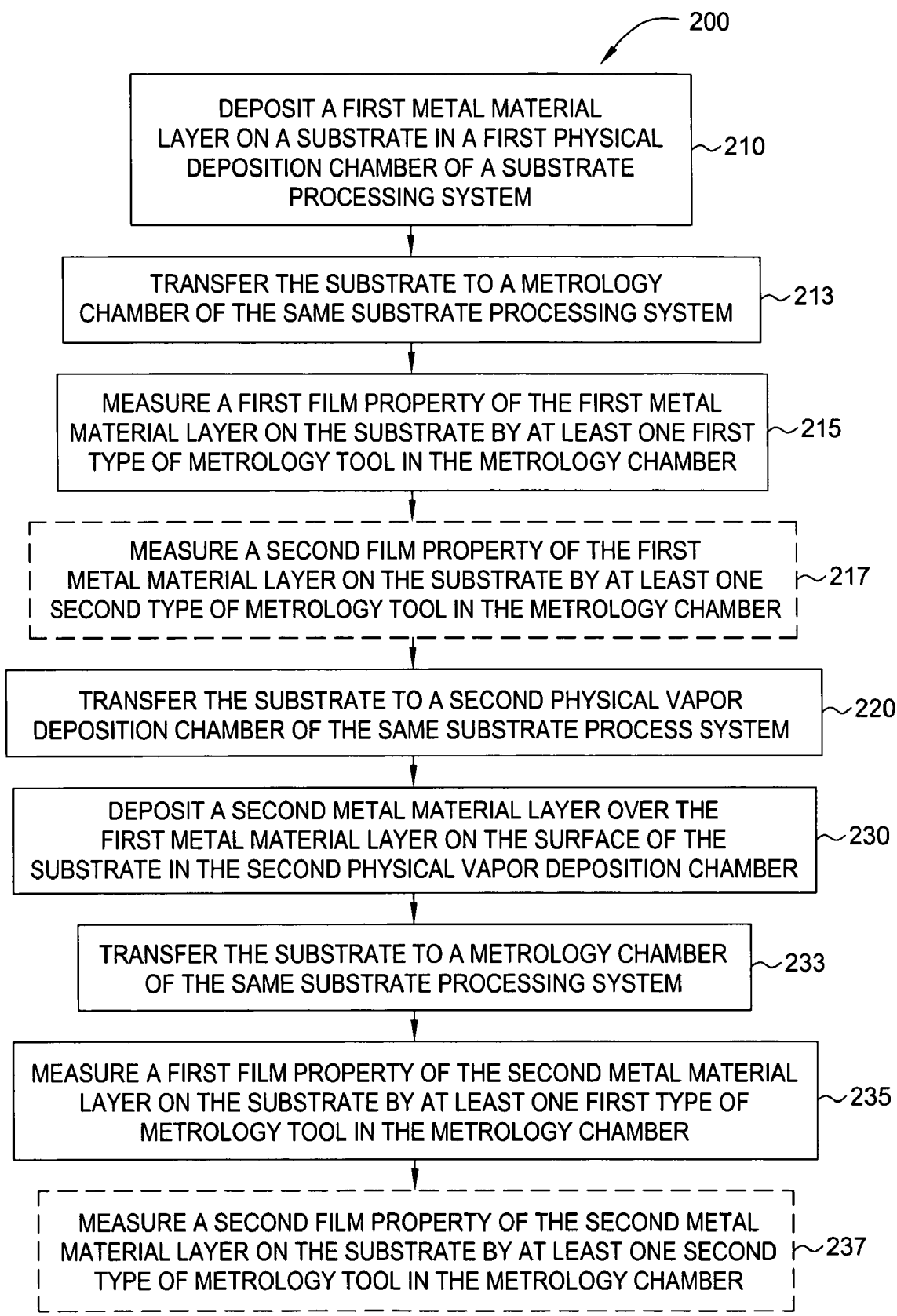
FIG. 3 shows a flow chart for depositing multiple layers of metal in a PVD substrate processing system.

FIG. 3 illustrates a flow chart of a method 200 for high throughput processing of a film stack in a processing system without the substrate leaving the system. The film stack may include multiple layers of different materials at varied thickness. At step 210, a first metal material layer is deposited on a substrate in a first PVD chamber of a substrate processing system. The first metal material layer may be used in a thin film transistor structure and may include one or more gate metal layers, conductor layers, or gate electrode layers. In another embodiment, the first metal material to be deposited on the substrate, thus, the first target material in the designated first PVD chamber, is chosen as a barrier material to prevent any chemical reaction between an underlying layer on the surface of the substrate and any subsequent material layers which may need to be deposited onto the substrate. As an example, a pure aluminum layer will tend to react to a substrate surface when silicon-containing materials are exposed on the substrate surface, and there is a need for a barrier layer, such as a titanium layer, to be deposited on the substrate before the pure aluminum layer is deposited onto the substrate surface.

In addition, the first metal material may include one or more layers of a metal material or an alloy material for a subsequent different metal material, and may serve as a barrier material for the subsequent metal material. In one example, a molybdenum nitride layer can be deposited before a subsequent molybdenum layer to be served as a barrier layer. Suitable first metal materials include, but are not limited to, aluminum neodymium (AlNd), aluminum nitride ($Al_xN_y$), molybdenum nitride ($Mo_xN_y$), titanium nitride (TiN), tantalum nitride (TaN), aluminum (Al), molybdenum (Mo), neodymium (Nd), tungsten (W), chromium (Cr), tantalum (Ta), titanium (Ti), copper (Cu), other metal nitrides, their alloys, indium tin oxide, zinc oxide and combinations thereof.

At step 213, the substrate is transferred to a metrology chamber of the same substrate processing system without taking the substrate out of the vacuum environment of the substrate processing system. At step 215, the first film property, such as film thickness, of the first metal material layer on the substrate is measured by at least one first type of metrology tool, such as a thickness measurement metrology tool, in the metrology chamber. At step 217, the second film property, such as particle count, of the first metal material layer on the substrate is optionally measured by at least one second type of metrology tool, such as a particle count measurement metrology tool, in the metrology chamber.

At step 220, the substrate is transferred to a second PVD chamber of the same substrate processing system for substrate processing without taking the substrate out of the vacuum environment of the substrate processing system. At step 230, a second metal material layer is deposited over the first metal material layer on the surface of the substrate in the second PVD chamber having a second target. The second target in the second PVD chamber comprises the second metal material for sputtering the second metal material layer and may also include other materials or components for structural support. In one embodiment, the first and the second PVD chambers having the first and the second target are designated such that there is no need to change the bulky and heavy targets for sequential deposition of the two or more metal materials on the substrate during substrate processing.

In one embodiment, the second metal material is a different material than the first metal material. In another embodiment, the second metal material is provided to enhance conductivity of a film stack containing the first and the second metal materials. For example, molybdenum can be deposited over aluminum neodymium on a substrate surface to increase the conductivity of a final film stack having a first layer of molybdenum and a second layer of aluminum neodymium since the conductivity of a single aluminum neodymium layer is not high enough to be used as a gate electrode layer. Suitable second metal materials include, but are not limited to, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), titanium nitride (TiN), tantalum nitride (TaN), other metal nitrides, their alloys, indium tin oxide, zinc oxide, and combinations thereof. The second metal material may be used as a gate metal layer, a conductor layer, a gate electrode layer, and combinations thereof.

At step 233, the substrate is transferred to a metrology chamber of the same substrate processing system without taking the substrate out of the vacuum environment of the substrate processing system. At step 235, the first film property, such as film thickness, of the second metal material layer on the substrate is measured by at least one first type metrology tool, such as a thickness measurement metrology tool, in the metrology chamber. At step 237, the second film property, such as particle count, of the second metal material layer on the substrate is optionally measured by at least one first type metrology tool, such as a thickness measurement metrology tool, in the metrology chamber.

In accordance with one or more aspects of the invention, the method 200 in FIG. 3 may include deposition of a third layer using a third PVD chamber of the same substrate processing system such that three designated PVD chambers can be used for a three-layer film stack sequentially deposited on a substrate. The third PVD chamber generally includes a third target, which comprises a third material, including, but not limited to, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), titanium nitride (TiN), tantalum nitride (TaN), other metal nitrides, their alloys, indium tin oxide, zinc oxide, and combinations thereof.

Referring back to FIG. 2, according to one aspect of the invention, the substrate processing system 400 generally includes a first PVD chamber 410 and a second PVD chamber 412. In one embodiment, the first PVD chamber 410 is configured to support substrate processing of a first metal material layer as described in the method 200 of FIG. 3 and the second PVD chamber 412 is configured to support substrate processing of a different metal material layer without the need to change to different targets or lid assemblies, which are generally large in dimension and thus very heavy in weight for flat panel display applications. The invention contemplates coupling other process chambers to the substrate processing system 400, such as an additional PVD chamber, ion metal implant (IMP), CVD, atomic layer deposition (ALD), plasma etching, annealing, cleaning, and other furnace chambers, etc.

Figure 4A:
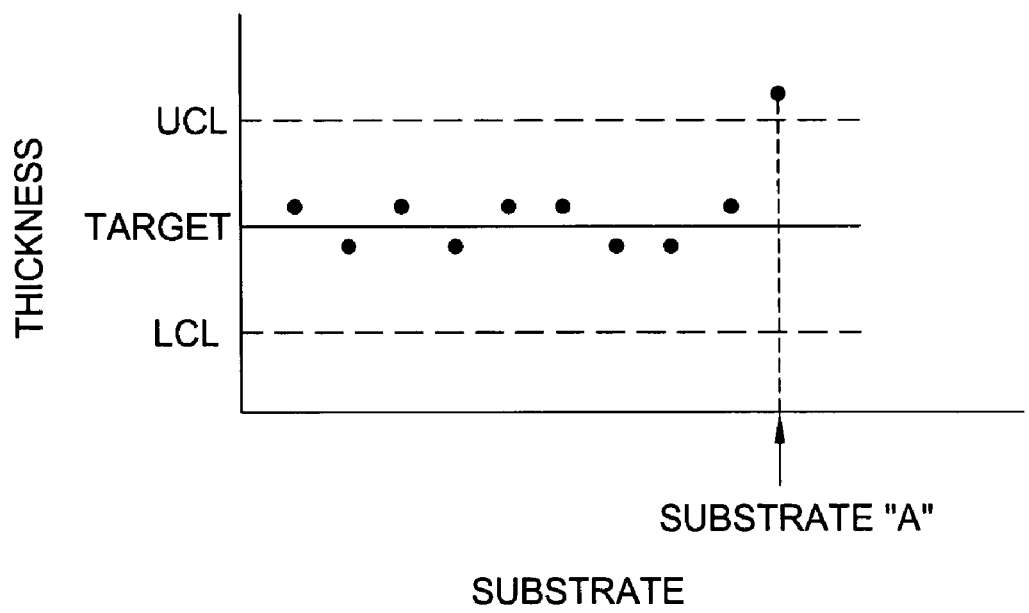
FIG. 4A shows an exemplary film thickness control chart.
Figure 4B:
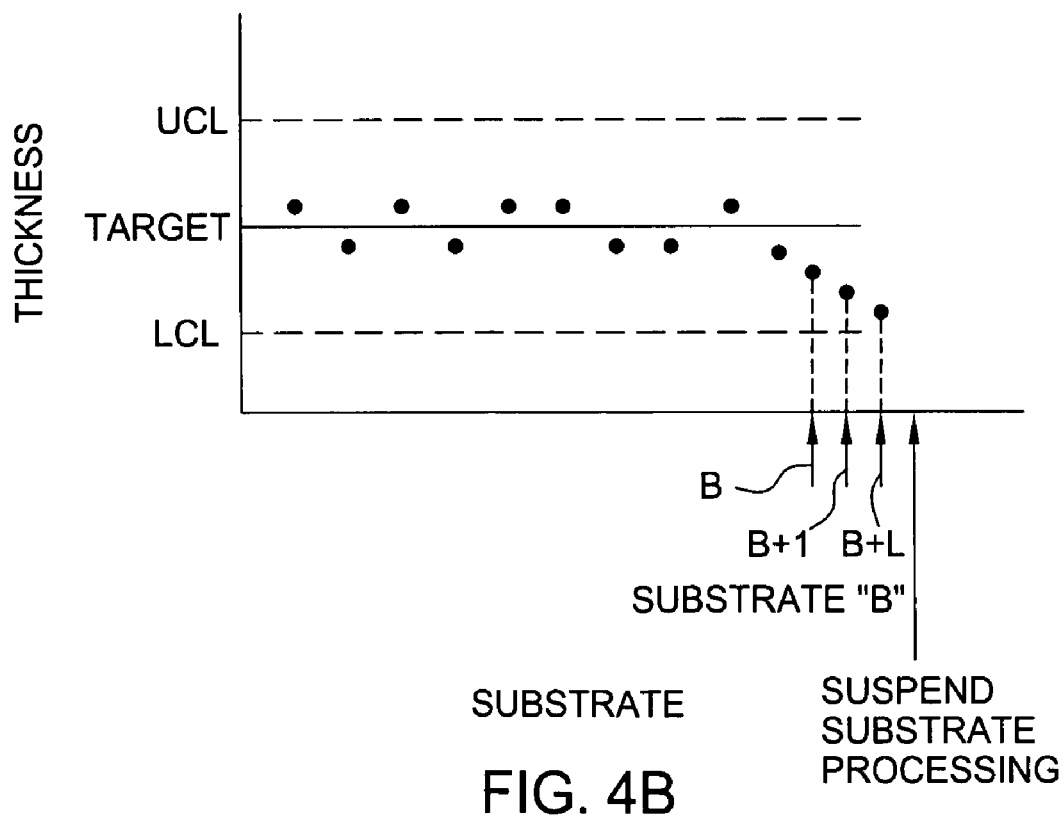
FIG. 4B show another exemplary film thickness control chart.

FIG. 4A shows an exemplary control chart for film thickness monitoring and control on monitored substrates that have been deposited a material layer in a substrate processing chamber. The film thickness can be a value taken at a specific location or an averaged value of values taken on multiple locations. The film thickness of the first nine monitored substrates are all within the upper control limit (UCL) and the lower control limit (LCL). When the film thickness of the film on substrate "A" (or $10^{th}$ substrate) exceeds the upper control limit (UCL), the substrate processing system can receive a control signal to halt further processing in the substrate processing chamber until the source of the problem is identified and corrected to prevent further mis-processing of substrates. FIG. 4B shows another exemplary control chart for film thickness monitoring and control. The film thickness can be a value taken at a specific location or an averaged value of values taken on multiple locations. When the film thickness starts to drift lower after substrate "B", the system controller would analyze the data and continue monitoring the system and suspend further processing when the trend continues for multiple substrates, for example 3 consecutive substrates, "B", "B+1", and B"+2". Although the substrate thickness does not fall below the lower control limit (LCL), the substrate processing system receives a control signal to suspend further substrate processing in the substrate processing chamber based on the thickness data trend, which shows a different pattern from the trending history.

Figure 5:
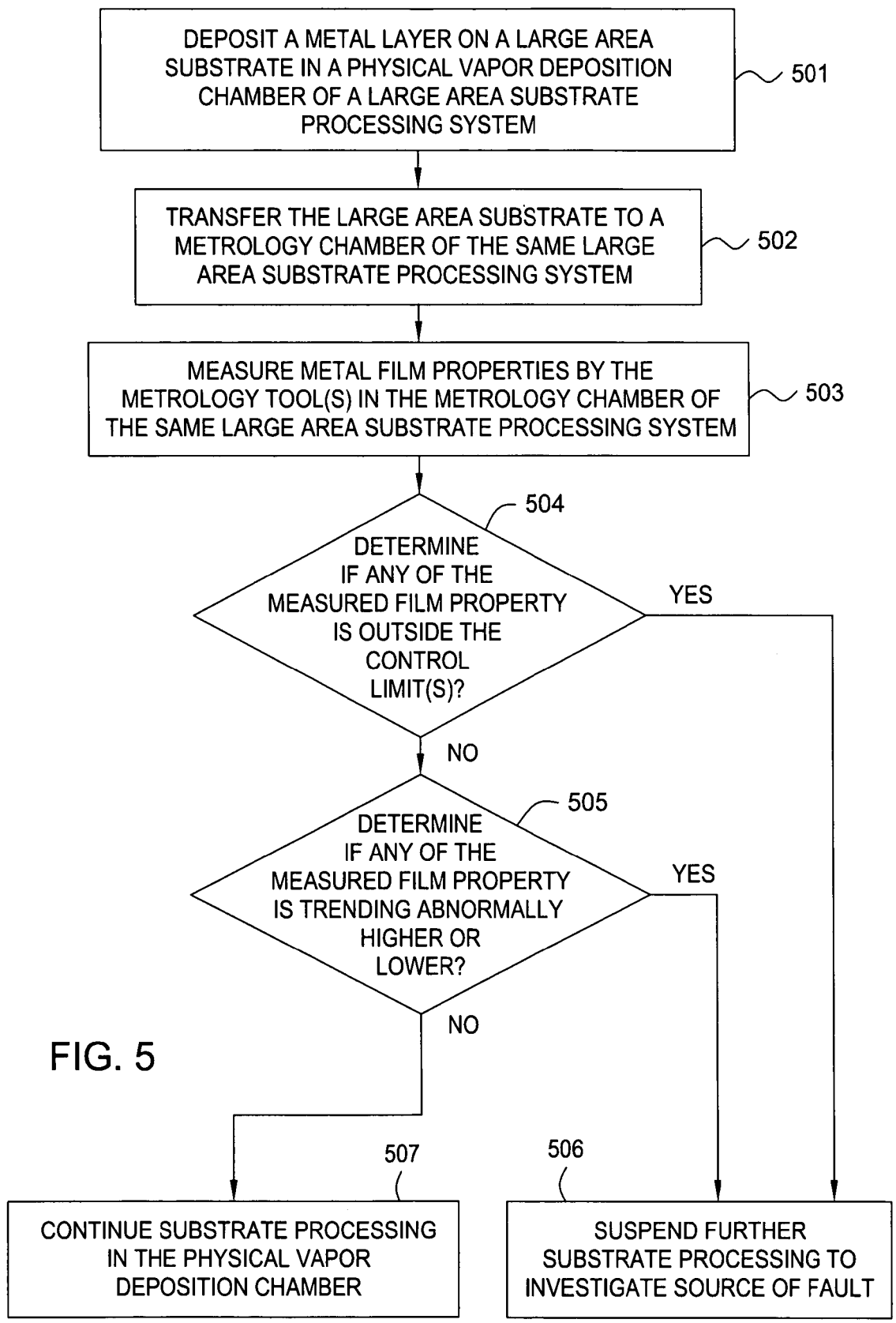
FIG. 5 shows an exemplary flow chart for metal film deposition.

FIG. 5 shows another flow chart of metal film deposition. At step 501, a metal layer is deposited on a large-area substrate in a physical vapor deposition chamber of a large-area substrate processing system. After the metal film deposition, the substrate is transferred to a metrology chamber of the same substrate processing system without taking the substrate out of the vacuum environment of the substrate processing system at step 502. At step 503, the metal film properties (or property) of the large-area substrate are measured in the metrology chamber of the same large-area substrate processing system. Once the film properties (or property) are measured, the substrate processing system controller (or computer) determines if any of the measured film properties (or property) are outside the control limits (or limit for single property) at step 504. If any of the measured film properties are outside the control limit, the system suspends further substrate processing in the process chamber at step 506. If the measured film properties are within control limit, the system controller (or computer) can further determine if the measured film properties are trending abnormally higher or lower at step 505. If the answer is "yes", the system suspends further substrate processing (at step 506). If the answer is "no", the system allows the substrate processing system to continue substrate processing (at step 507). The measuring and monitoring of substrate film properties do not have to occur on every substrate that has been processed. The measuring and monitoring can occur after a selected number of substrates have been processed.

For metal film, the metal film thickness can be measured by metal film thickness measurement tools, such as MetalPULSE system made by Rudolph Technology of Flanders, N.J. MetalPULSE system is only one of the metal film thickness measurement tools that can be used to measure metal film thickness. Other types of metal film thickness measurement tools can also be used. One or more MetalPULSE systems can be installed in the metrology chamber 418. Taking thickness information at one location on the substrate surface can provide thickness information to check for thickness trend. Typically, if only one thickness metrology tool is used, the metrology tool is placed near the center of the substrate. If the deposited thickness on a series of substrates gradually drifts outside the control limit, or suddenly falls outside the control limit, the system controller can send information to the chamber to halt further processing for other substrates. Taking the thickness at more than one location can provide thickness uniformity information.

In addition to metal film thickness, metal sheet resistance can be measured to detect the metal film quality and thickness of the metal film deposited. Metal sheet resistance can be measured by a "four-point probe," which can be non-destructive. Similar to metal film thickness measurement, one or more metal sheet resistance measurement tools (or probes) can be installed in the measurement chamber, which can be a process chamber, a metrology chamber, a transfer chamber, or a loadlock, to collect data. If the sheet resistance is too high or too low (out of control range), it could signal problems in the process chamber and further processing can be halted to prevent further substrate mis-processing. In addition to sheet resistance, particle measurement on the substrate surface is also important. Substrate surface particle measurement tools, such as SURFSCAN made by KLA-Tencor of San Jose, Calif., can be installed in the metrology chamber to detect particle count in a localized region on a substrate surface. If the particle count exceeds the control limit or starts to drift higher, it could signal potential problems in the process chamber. Film stress is also a film property that can be measured and its value can also serve as an indication of film property. However, measuring film stress typically requires a pre-deposition measurement to be subtracted from the post-deposition measured value. In one embodiment, a plurality of thin film metrology tools of multiple types may be installed in the metrology chamber to measure post deposition film properties. In one embodiment, a plurality of metrology tools of a particular type may be installed in the metrology chamber to measure post deposition film properties.

Figure 6A:
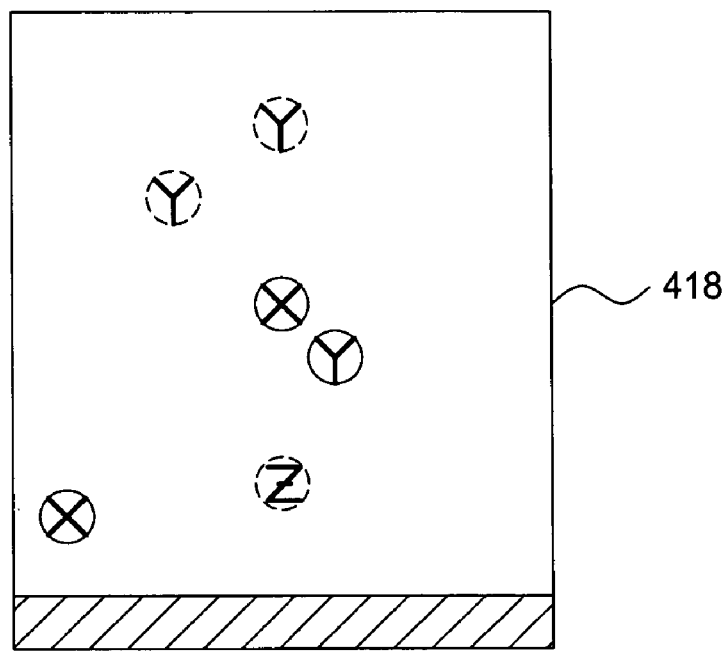
FIG. 6A shows an exemplary metrology chamber with multiple types and numbers of metrology tools.

FIG. 6A shows one embodiment of the current invention. There are at least two types of metrology tools, "X" and "Y" metrology tools. For example, "X" metrology tool could be a thickness measurement tool and "Y" metrology tool could be a particle measurement tool. There are two "X" metrology tools, one placed near the center of the substrate and one near the corner of the substrate. For example, if the "X" metrology tool is a thickness measurement tool, the thickness measured near the center and edge of the substrate could give a good indication of performance of the chamber in terms of film deposition thickness. If the other type of metrology tool "Y" is a particle count measurement tool, the particle count measurement can also indicate the particle performance of the chamber. The thickness and particle count measurement tools are just used as examples. "X" and "Y" could be any types of metrology tools. For metrology tool, such as particle counts measurement tool, the measurement can be anywhere on the substrate and is not limited to near the center of the substrate. The "Y" tools in dotted line circles show other possible locations. Of course, it's also possible to have a third, fourth, or additional types of metrology tool in the metrology chamber to measure other film properties. In FIG. 6A, there is at least one of another metrology tool "Z" (in dotted circle) that can be used to measure another film property. One or more metrology tool "Z", such as a sheet resistance probe, can be placed anywhere over the substrate.

Figure 6B:
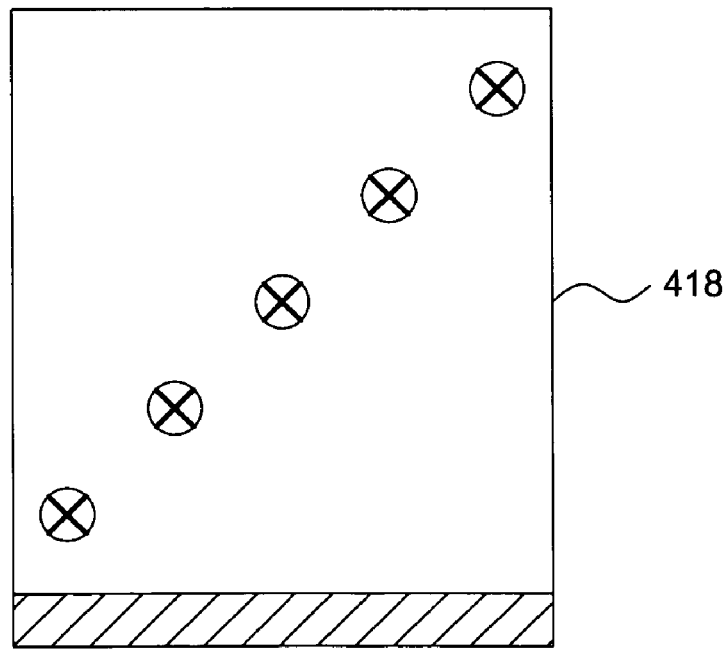
FIG. 6B shows another exemplary metrology chamber with 5 metrology tools.

FIG. 6B shows an embodiment of the current invention. Five "X" metrology tools are placed along a diagonal line above the substrate. Examples of the "X" metrology tool include thickness measurement tool and sheet resistance measurement tool. Placing many of same type of metrology tools above the substrate surface allow the uniformity of the film property to be measured. Fewer or an additional number of the metrology tools, such as 3, 9, or more can also be placed to measure film property uniformity. Also more than 2 of 2 or more types of metrology tools can be placed in the metrology chamber. Using a dedicated metrology chamber allows flexibility in placing the number and types of metrology tools. For transparent substrates, it is also possible to place thickness measurement metrology tools below the substrates to measure film thickness.

Figure 7:
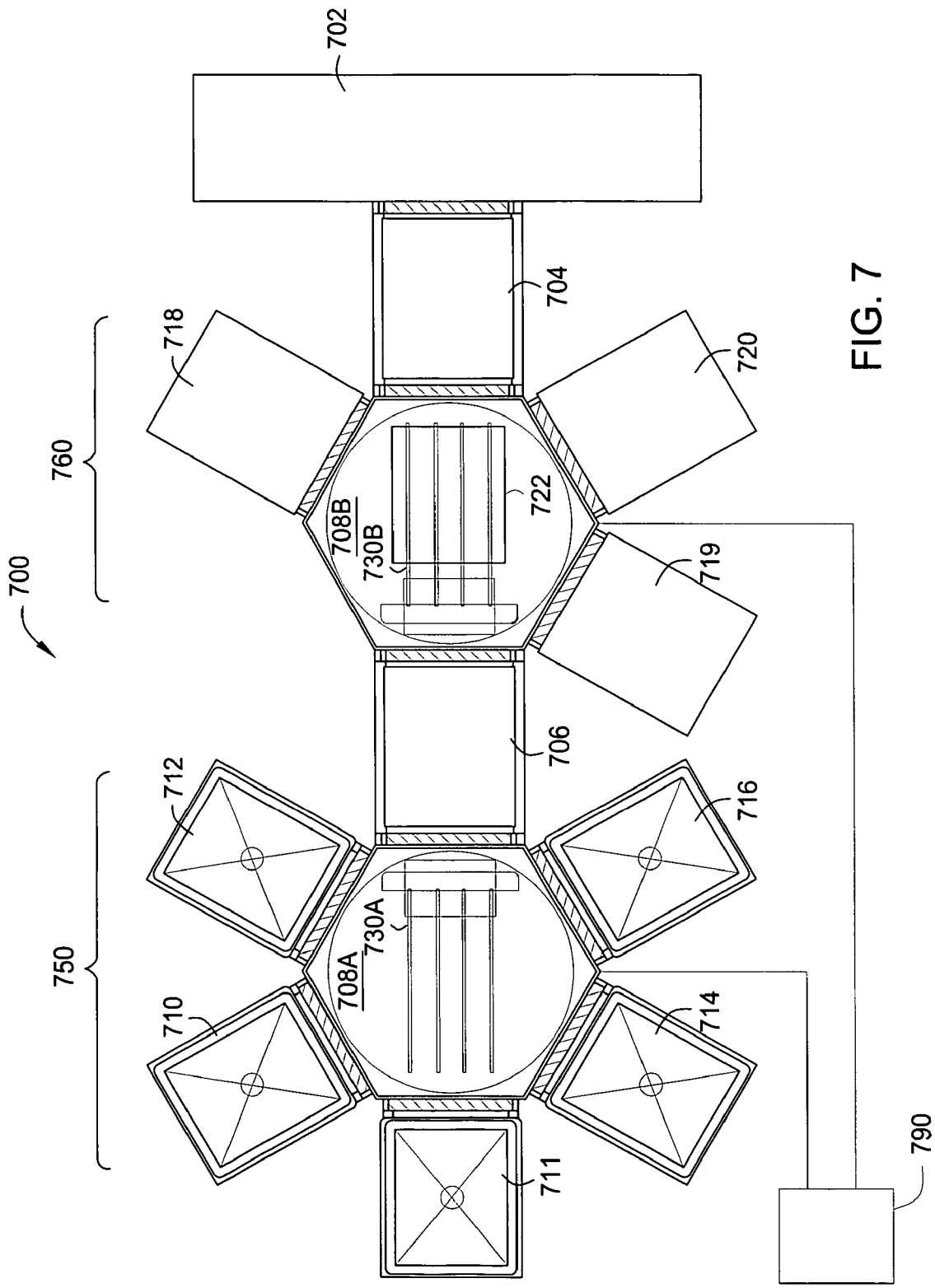
FIG. 7 shows an exemplary PVD-CVD processing system.

FIG. 7 is a top plan view of an exemplary substrate processing system 700 suitable for processing different types of metal and silicon-containing films on a substrate 722 using various deposition techniques according to embodiments of the invention. The substrate processing system 700 includes two transfer chambers 708A, 708B coupled to a factory interface 702 via load lock chambers 704, 706.

The factory interface 702 may also include an atmospheric robot, such as a dual blade atmospheric robot. The atmospheric robot is adapted to transfer one or more substrates between the one or more substrate storage cassettes and the load lock chamber 704. Typically, the factory interface 702 is maintained at or slightly above atmospheric pressure and the load lock chamber 704 is disposed to facilitate substrate transfer between a vacuum environment of the transfer chamber 708 and a generally ambient environment of the factory interface 702. The use of the second load lock chamber provides a reliable substrate processing system, high substrate processing throughput, substrate flow through between different types of process chambers and process modules, and a vacuum buffer region between different types of process chambers and process modules. For example, the vacuum pressure requirements for different types of process chambers and process modules may be different (e.g., a PVD process may need to be at a lower vacuum pressure level, thus, a higher degree of vacuum, than a CVD process). In addition, the use of the transfer chamber 708A, the transfer chamber 708B, and the second load lock chamber in the substrate processing system 700 allows the use of different vacuum pressure levels or staged vacuum levels such that different types of pumps, such as a dry pump, a roughing pump, a turbo pump, and a cryogenic pump, among others, can be used to save equipment cost, lifetime, and maintenance. For example, the first transfer chamber 708A, the second transfer chamber 708B, and/or the second load lock chamber 706 can be kept in an intermediate vacuum environment using a less expensive pump, such as a regular dry pump or a shared pump coupled to various chambers, while the process chambers can be kept in a high vacuum environment using a more expensive pump, such as a cryogenic pump.

The transfer chamber 708A or 708B is adapted to transfer substrates among a plurality of process chambers 710, 712, 714, 716, 718, 720, and one or more load lock chambers 704, 706 such that the transfer chamber 708A, or 708B is surrounded by one or more process chambers 710, 712, 714, 716, 718, 720 and one or more load lock chambers 704, 706. The transfer chambers 708A, 708B are maintained at a vacuum condition to eliminate or minimize pressure differences between the transfer chamber 408 and the individual process chambers 710, 712, 714, 716, 718, 720 after each substrate transfer.

According to one aspect of the invention, the substrate processing system 700 generally includes a process module 750 and a process module 760. In one embodiment, the process module 750 is adapted to include a specific type of process chamber and the process module 760 is adapted to include a different type of process chamber. For example, the process module 750 may include one or more CVD chambers. As another example, the process module 760 may include one or more PVD chambers. The invention contemplates coupling other types of process chambers to the process module 750 and the process module 460, such as PVD, ion metal implant (IMP), CVD, atomic layer deposition (ALD), plasma etching, annealing, cleaning, and other furnace chambers, etc. Additional process chambers, such as etching chambers, ashing chambers, ion implant chambers, heating chambers, among others, can also be coupled to the transfer chamber 708B to perform additional processes on the substrate 722 after being processed by the deposition process systems of process module 760.

In the embodiment of FIG. 7, the substrate processing system 700 is provided. In FIG. 7, the load lock chamber 704 is coupled to the process module 760 such that the substrate 722 to be processed is first loaded onto the load lock chamber 704, transferred through the transfer chamber 708B of the process module 760, and placed onto the load lock chamber 706 using the transfer robot 730B.

After transferring through the transfer chamber 708B and the load lock chamber 706, and into the transfer chamber 708A, the substrate 722 is transferred by the transfer robot 730A into one or more process chambers of the process module 750 for one or more layers to be deposited on the substrate 722. Then, the substrate 722 is transferred through the load lock chamber 706, back to the transfer chamber 708B to be delivered by the transfer robot 730A into the one or more process chambers of the process module 760. The substrate processing system 700 is controlled by a system control unit 790, which could include controller(s), computer(s), and memory (or memories). The substrate processing system 700 is controlled by a system control unit 790, which could include controller(s), computer(s), and memory (or memories).

Figure 8A:
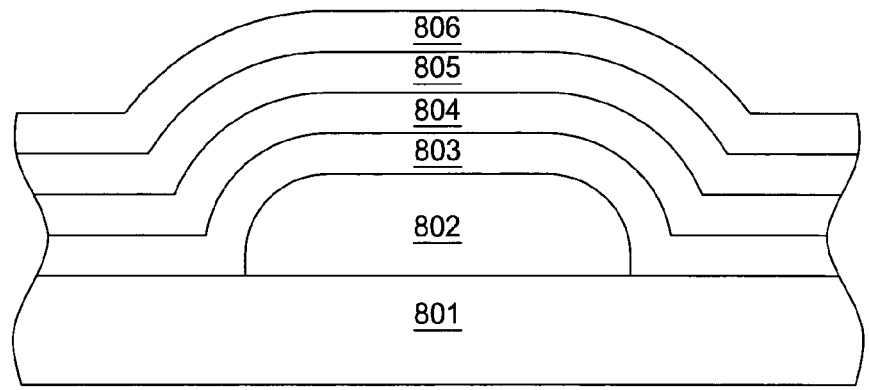
FIG. 8A depicts a cross-sectional schematic view of an intermediate stage of fabricating an exemplary bottom gate thin film transistor using a PVD-CVD processing system.
Figure 8B:
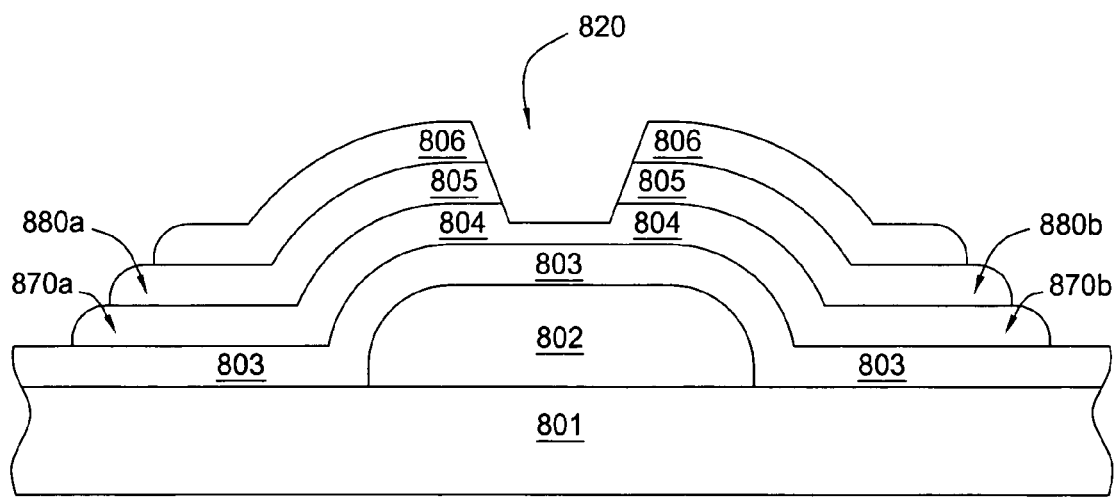
FIG. 8B depicts a cross-sectional schematic view of a patterned film stack of FIG. 8A.

FIGS. 8A and 8B illustrate one embodiment of depositing multilayer film stacks on the substrate 801 using a CVD-PVD hybrid deposition system. This type of film stack can be applied to a 4 mask substrate processing and patterning technique. The invention provides the convenience that all the deposition steps can be completed in a single substrate processing system, thereby reducing and eliminating unnecessary substrate transfer and vacuum break.

In FIG. 8A, a gate insulation layer 803 is deposited over a gate electrode layer 802, which is deposited and patterned over the substrate 801 by separate processing systems. The gate dielectric layer 803 may be silicon dioxide ($SiO_2$), silicon oxynitride (SiON), or silicon nitride (SiN). For example, the gate insulation layer 803 can be deposited using any of the process chambers of the invention, such as the process chambers 710, 712, 714, 716. Afterwards, a bulk semiconductor layer 804 is deposited over the gate insulation layer 803 using a substrate processing chamber of the same processing system used to deposit the gate insulation layer 803. The bulk semiconductor layer 804 may comprise polycrystalline silicon (polysilicon) or amorphous silicon ($\alpha$-Si). In one embodiment, the gate insulation layer 803 and the bulk semiconductor layer 804 are deposited in a single substrate processing system using the same process chamber for depositing the two layers, such as a PECVD process chamber of the invention, or sequentially in two process chambers (e.g., the process chamber 710, 712, 714, 716).

Following the bulk semiconductor layer 804 deposition, a doped semiconductor layer 805 is deposited over the bulk semiconductor layer 804 using a substrate processing chamber of the same processing system used to deposit the gate insulation layer 803 and the bulk semiconductor layer 804. The doped semiconductor layer 805 may comprise n-type (n+) or p-type (p+) doped polycrystalline (polysilicon) or amorphous silicon ($\alpha$-Si). The 803, 804 and 805 layers can be deposited in the same process chamber or sequentially in two or more process chambers (e.g., the process chamber 710, 712, 714, 716).

A conductive layer 806 is deposited over the doped semiconductor layer 805 using the substrate processing chamber of the same processing system used to deposit the gate insulation layer 803, the bulk semiconductor layer 804 and the doped semiconductor layer 805. The conductive layer 806 may comprise a metal such as, for example, aluminum (Al), tungsten (W), molybdenum (Mo), chromium (Cr), tantalum (Ta), and combinations thereof, among others. The conductive layer 106 is deposited over the doped semiconductor layer 805 in a single substrate processing system of the invention using two different types of process chambers configured into the first process module 750 and the second process module 760 without taking the substrate out of the substrate processing system to clean the surface of the substrate. This is especially desirable when a metal-containing material layer, such as the conductive layer 806, is usually deposited by a PVD process and a silicon-containing material layer, such as the semiconductor layer 805, is usually deposited by a CVD process. The invention provides that these two different types of material layers, even if different types of CVD and PVD process chambers are required, can be deposited in a single substrate processing system, such that no cleaning the surface of the contamination or breaking the vacuum is needed.

In one embodiment, the conductive layer 806 deposited by the substrate processing system is a single material as deposited using one process chamber of the invention, such as the process chamber 718, 720. In another embodiment, the conductive layer 806 deposited by the substrate processing system includes a multilayer of different conductive materials deposited by one or more process chambers of the invention, such as one or more PVD process chambers. For example, the conductive layer 806 may include a triple layer having a molybdenum layer as deposited by the process chamber 718 which may be configured to include a molybdenum containing PVD target. An aluminum layer can be deposited over the molybdenum layer by transferring the substrate to the process chamber 720 configured to include an aluminum containing PVD target. A second molybdenum layer can be deposited over the aluminum layer by transferring the substrate back to the process chamber 718 having the molybdenum containing PVD target. The methods and the substrate processing systems of the invention thus provided require no change of the PVD target above the process chamber during multilayer thin film deposition of a PVD process and no cleaning of the substrate surface prior to and after a PVD process.

In FIG. 8B, the film stack in FIG. 8A is patterned to include an active region 820 in the channel, a source region 870a and a drain region 870b in the doped semiconductor layer 805, and a source contact region 880a and a drain contact region 880b in the conductive layer 806.

During the sequential deposition of film layers 803, 804, 805, and 806, it's desirable to monitor the film deposition qualities to improve process control. To monitor the processes of layer 803, 804, and 805 done in the CVD system 750, metrology tools can be installed in the transfer chamber 708A, the loadlock 706, or one metrology chamber connected to the transfer chamber 708A. In one embodiment, the metrology tools are installed in a metrology chamber that is connected to the transfer chamber 708A. The metrology chamber could be chamber 711. The metrology tools in the metrology chamber can be used to monitor film deposition quality of layers 803, 804 and 805. The substrates monitored can be every substrate that is processed or selected substrates. The layer being monitored can be every layer deposited, 803, 804 and 805, or selected layer(s) chosen from deposited layers.

Layer 803 is a gate dielectric layer and could be film, such as silicon dioxide ($SiO_2$), silicon oxynitride (SiON), or silicon nitride (SiN). The film properties to be monitored for dielectric film include: film thickness, film content, film stress, particle counts, and the like, after substrate processing. Film composition can be determined by using FTIR (Fourier Transform Infra-Red). For example, the hydrogen content of SiN can indicate the quality of the SiN film and the hydrogen content of SiN can be measured by FTIR. Similar to the metal film, the film stress determination of dielectric film also requires pre-deposition measurement to allow the pre-deposition value to be subtracted from the post-deposition value.

The bulk semiconductor layer 804, such as polycrystalline silicon (polysilicon) or amorphous silicon ($\alpha$-Si), can be monitored by film thickness, film content, film stress, particle counts, and the like. The doped semiconductor layer 805, such as n-type (n+) or p-type (p+) doped polycrystalline (polysilicon) or amorphous silicon ($\alpha$-Si), can also be monitored by film thickness, film content, film stress, particle counts, and the like.

Similar to the description for metrology chamber 418 earlier, there could be more than one or more types of metrology tools and one or more tools of each type of metrology tools.

The conductive layer 806 is deposited in a process chamber of processing system 760. The metrology tools used to monitor the properties of layer 806 could be installed in transfer chamber 708B, loadlock 704, or a metrology chamber 719. In one embodiment, the metrology tools are installed in a metrology chamber 719. Similar to the description for metrology chamber 418 earlier, there could be more than one or more types of metrology tools and one or more tools of each type of metrology tools.

In addition to monitoring the process chamber and suspending substrate processing upon fault detection, the measured properties of the substrate can also be used to change the process parameters of the process chamber. For example, if the film thickness measured has gradually decreased, the gas flows of the reactive gases can be increased to increase the deposition rate. The post-processing measurement can also be done in an ex-situ metrology tool(s). The data of the ex-situ metrology tool(s) can be fed back (manually or electrically) to the processing system to monitor and to control the process chamber.

While the foregoing is directed to embodiments of the present invention, other and further embodiments of the invention may be devised without departing from the basic scope thereof, and the scope thereof is determined by the claims that follow.

The invention claimed is:

1. A metrology chamber of a substrate processing module adapted to monitor and/or control at least one substrate processing chamber of the substrate processing module, comprising:

at least one first metrology tool disposed in the metrology chamber, wherein the at least one first metrology tool is a film thickness measurement tool; and at least one second metrology tool. physically separate and distinct from the at least one first metrology tool, disposed in the same metrology chamber, wherein there are at least two film thickness measurement tools and one of the film thickness measurement tools is placed to measure film thickness near the center of a substrate that has been processed in one of the at least one substrate processing chamber and the other film thickness measurement tool is placed to measure film thickness away from the center of the substrate.

2. A large area substrate processing system comprising:

a plurality of substrate processing chambers coupled to a transfer chamber; and a metrology chamber coupled to a transfer chamber, the metrology chamber comprising:

at least a first metrology tool disposed in the metrology chamber, wherein the first metrology tool is a film thickness measurement tool; and at least a second metrology tool disposed in the same metrology chamber, wherein there are at least two film thickness measurement tools and the first film thickness measurement tool is placed to measure film thickness near the center of a substrate that has been processed in one of the plurality of substrate processing chambers and the second film thickness measurement tool is placed to measure film thickness away from the center of the substrate.

* * * * *

UNITED STATES PATENT AND TRADEMARK OFFICE
CERTIFICATE OF CORRECTION

PATENT NO. : 7,566,900 B2  Page 1 of 1
APPLICATION NO. : 11/216801
DATED : July 28, 2009
INVENTOR(S) : Le et al.

It is certified that error appears in the above-identified patent and that said Letters Patent is hereby corrected as shown below:

Column 2, Line 2, please delete "devices" and insert --device-- therefor.

Signed and Sealed this

Twenty-ninth Day of September, 2009

David J. Kappos
*Director of the United States Patent and Trademark Office*